(12) United States Patent
Noda et al.

(10) Patent No.: US 10,641,553 B2
(45) Date of Patent: May 5, 2020

(54) HEAT TREATMENT APPARATUS, REGULATION METHOD OF HEAT TREATMENT APPARATUS, AND PROGRAM

(71) Applicant: Tokyo Electron Limited, Tokyo (JP)

(72) Inventors: Yuto Noda, Iwate (JP); Tatsuya Yamaguchi, Hokkaido (JP); Masayoshi Masunaga, Iwate (JP); Koji Yoshii, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 376 days.

(21) Appl. No.: 15/172,368

(22) Filed: Jun. 3, 2016

(65) Prior Publication Data

US 2016/0363373 A1    Dec. 15, 2016

(30) Foreign Application Priority Data

Jun. 10, 2015    (JP) .................................. 2015-117527

(51) Int. Cl.
*F27D 19/00* (2006.01)
*F27B 1/10* (2006.01)
(Continued)

(52) U.S. Cl.
CPC ................ *F27D 19/00* (2013.01); *F27B 1/02* (2013.01); *F27B 1/10* (2013.01); *F27B 17/0025* (2013.01);
(Continued)

(58) Field of Classification Search
CPC ............. F27D 19/00; F27D 2019/0096; F27D 2019/0003; H01L 21/67248;
(Continued)

(56) References Cited

U.S. PATENT DOCUMENTS 5,775,889 A * 7/1998 Kobayashi .............. C23C 16/46
                                                  432/12
5,867,397 A * 2/1999 Koza ....................... G06F 17/50
                                                  703/14
(Continued)

FOREIGN PATENT DOCUMENTS

JP        2003-005802 A      1/2003
JP        2003-100645 A      4/2003
(Continued)

*Primary Examiner* — Jarrett J Stark
(74) *Attorney, Agent, or Firm* — Abelman, Frayne & Schwab

(57) ABSTRACT

The controller receives information including a plurality of evaluation indexes, a weight of each evaluation index, the number of times for calculating a value of an evaluation function, and initial parameter values, and performs a simulation based on the received information. Then, the controller calculates a value of an evaluation function based on a result of the simulation, and determines whether the calculated value of the evaluation function is minimum, to update parameters when it is determined that the value of the evaluation function is minimum. In the calculation of a value of the evaluation function, a value of the evaluation function is calculated again based on the number of times for calculating a value of an evaluation function. The controller generates new parameters by a genetic algorithm when a value of an evaluation function is calculated again.

9 Claims, 6 Drawing Sheets

(51) Int. Cl.
  *F27B 1/02* (2006.01)
  *G05B 13/04* (2006.01)
  *G06N 3/12* (2006.01)
  *F27B 17/00* (2006.01)
  *H01L 21/67* (2006.01)

(52) U.S. Cl.
  CPC ............ *G05B 13/042* (2013.01); *G06N 3/126* (2013.01); *H01L 21/67109* (2013.01); *H01L 21/67248* (2013.01); *F27D 2019/0096* (2013.01)

(58) Field of Classification Search
  CPC .............. H01L 21/67109; G06N 3/126; F27B 17/0025; F27B 1/02; F27B 1/10; G05B 13/042
  See application file for complete search history.

(56) References Cited

U.S. PATENT DOCUMENTS

| | | | | |
|---|---|---|---|---|
| 5,878,191 | A * | 3/1999 | Miyashita | H01L 21/67115 392/416 |
| 5,895,596 | A * | 4/1999 | Stoddard | C23C 16/52 118/725 |
| 6,169,981 | B1 * | 1/2001 | Werbos | G05B 13/0265 706/15 |
| 6,637,008 | B1 * | 10/2003 | Higuchi | G06N 3/126 716/132 |
| 8,356,000 | B1 * | 1/2013 | Koza | G06N 3/126 706/13 |
| 9,727,692 | B2 * | 8/2017 | Harris | G06F 19/22 |
| 2003/0121905 | A1 * | 7/2003 | Nanno | G05B 11/32 219/494 |
| 2004/0112885 | A1 * | 6/2004 | Shigeoka | H01L 21/67115 219/388 |
| 2005/0210438 | A1 * | 9/2005 | Verstappen | G03F 7/705 430/30 |
| 2007/0010403 | A1 * | 1/2007 | Nanno | G05D 23/1917 505/430 |
| 2008/0082197 | A1 * | 4/2008 | Lacaille | G05B 23/0232 700/121 |
| 2008/0192023 | A1 * | 8/2008 | Yamamoto | G06F 9/451 345/173 |
| 2008/0276215 | A1 * | 11/2008 | Higuchi | G03F 1/36 716/55 |
| 2011/0017368 | A1 * | 1/2011 | Okamura | C21D 1/62 148/568 |
| 2011/0029468 | A1 * | 2/2011 | Fox | G06N 3/126 706/13 |
| 2011/0034342 | A1 * | 2/2011 | Fox | C40B 50/02 506/7 |
| 2012/0185813 | A1 * | 7/2012 | Kaushal | G05B 19/41875 716/112 |
| 2015/0066824 | A1 * | 3/2015 | Harris | G06F 19/18 706/13 |
| 2016/0363373 | A1 * | 12/2016 | Noda | F27D 19/00 |
| 2017/0114464 | A1 * | 4/2017 | Iriuda | C23C 16/4584 |

FOREIGN PATENT DOCUMENTS

| | | |
|---|---|---|
| JP | 2006-080489 A | 3/2006 |
| JP | 2006-332146 A | 12/2006 |
| JP | 2008-262492 A | 10/2008 |
| JP | 2012-190274 A | 10/2012 |
| JP | 2014-194966 A | 10/2014 |

\* cited by examiner

HEAT TREATMENT APPARATUS, REGULATION METHOD OF HEAT TREATMENT APPARATUS, AND PROGRAM

CROSS-REFERENCE TO RELATED APPLICATIONS

This application is based on and claims priority from Japanese Patent Application No. 2015-117527 filed on Jun. 10, 2015 with the Japan Patent Office, the disclosure of which is incorporated herein in its entirety by reference.

TECHNICAL FIELD

The present disclosure relates to a heat treatment apparatus that performs a heat treatment on an object to be processed (e.g., a semiconductor wafer), a regulation method of the heat treatment apparatus, and a program.

BACKGROUND

In a semiconductor device manufacturing process, a batch-type heat treatment apparatus has been used to perform, for example, a film formation processing, an oxidation processing, or a diffusion processing collectively on a plurality of objects to be processed such as, for example, semiconductor wafers. In the batch-type heat treatment apparatus, for example, the film formation of the semiconductor wafers may be efficiently performed, but there is a problem in that it is difficult to regulate parameters such as, for example, a temperature within a processing container.

In order to solve this problem, for example, Japanese Patent Laid-Open Publication No. 2003-100645 has proposed a heat treatment method of outputting a set temperature different from a target temperature at the time of carry-in of a wafer boat, and changing the set temperature to a second set temperature corresponding to the target temperature at the time of completion of the carry-in of the wafer boat, or before or after the completion.

SUMMARY

A heat treatment apparatus according to a first aspect of the present disclosure includes a receiving unit that receives information including a plurality of evaluation indexes, a weight of each evaluation index, the number of times for calculating a value of an evaluation function, and initial parameter values, a simulation performing unit that performs a simulation based on the information received by the receiving unit, an evaluation function value calculating unit that calculates a value of an evaluation function based on a result of the simulation performed by the simulation performing unit, and a parameter updating unit that determines whether the value of the evaluation function calculated by the evaluation function value calculating unit is minimum, to update parameters when it is determined that the value of the evaluation function is minimum. The evaluation function value calculating unit calculates a value of the evaluation function again based on the number of times for calculating a value of an evaluation function received by the receiving unit, and the heat treatment apparatus further includes a parameter generating unit that generates new parameters by a genetic algorithm when a value of the evaluation function is calculated again by the evaluation function value calculating unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
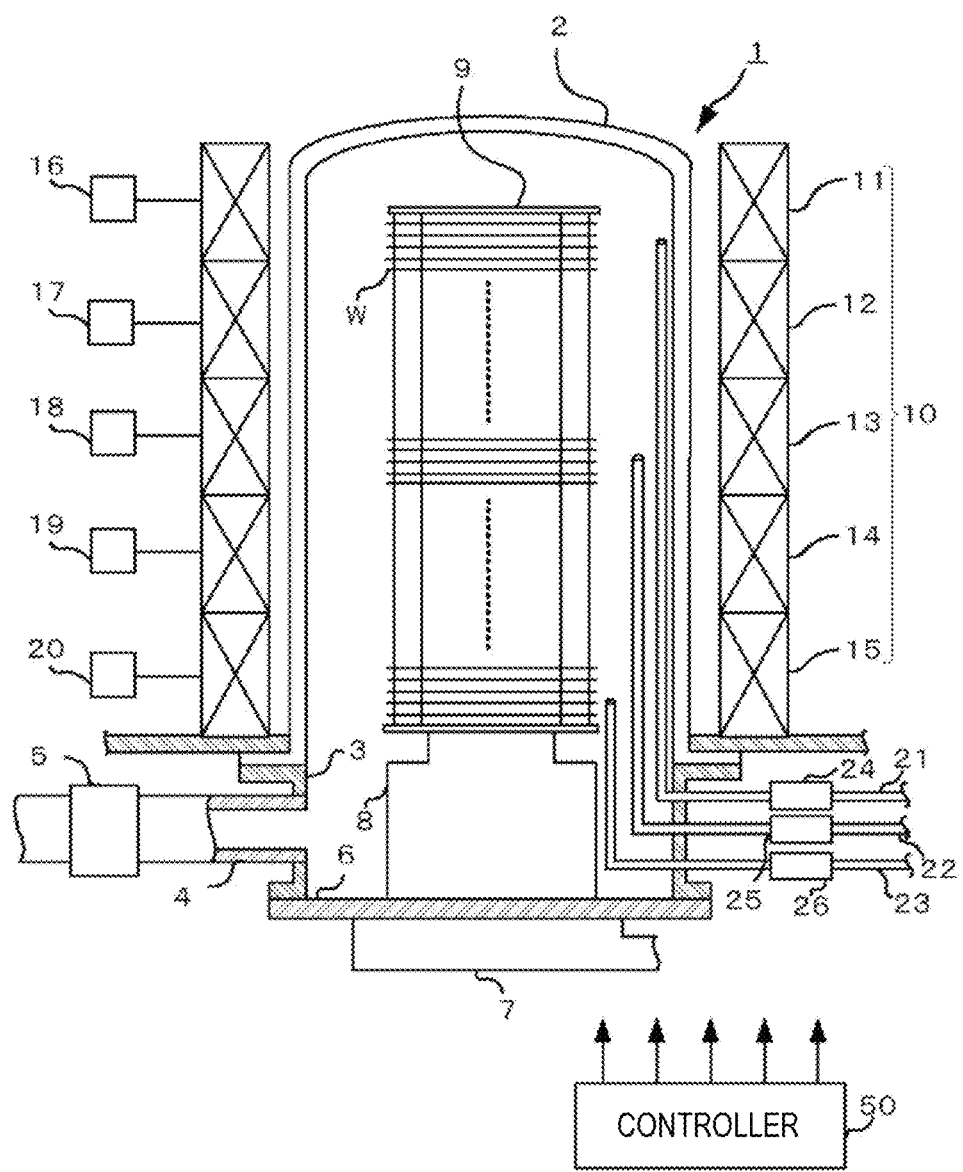
FIG. 1 is a view illustrating a structure of a heat treatment apparatus according to an exemplary embodiment of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In a temperature control of the heat treatment apparatus, it is required to design a temperature controller by proportional-integral-derivative (PID) parameter regulation that repeats regulation and a test of parameters plural times. However, since repeating regulation and a test of parameters multiple times requires a lot of time and labor, what is demanded is a heat treatment apparatus in which the regulation of parameters may be easily regulated.

The present disclosure has been made in consideration of the above-described problem, and an object thereof is to provide a heat treatment apparatus capable of easily performing regulation of parameters, a regulation method of the heat treatment apparatus, and a program.

In order to achieve the above-described object, a heat treatment apparatus according to a first aspect of the present disclosure includes: a receiving unit that receives information including a plurality of evaluation indexes, a weight of each evaluation index, the number of times for calculating a value of an evaluation function, and initial parameter values, a simulation performing unit that performs a simulation based on the information received by the receiving unit, an evaluation function value calculating unit that calculates a value of an evaluation function based on a result of the simulation performed by the simulation performing unit, and a parameter updating unit that determines whether the value of the evaluation function calculated by the evaluation function value calculating unit is minimum, to update parameters when it is determined that the value of the evaluation function is minimum. The evaluation function value calculating unit calculates a value of the evaluation function again based on the number of times for calculating a value of an evaluation function received by the receiving unit, and the heat treatment apparatus further includes a parameter generating unit that generates new parameters by a genetic algorithm when a value of the evaluation function is calculated again by the evaluation function value calculating unit.

The evaluation indexes are, for example, at least, a sum of errors from a target value and a sum of differential absolute values of power. The information received by the receiving unit may include threshold values of the evaluation indexes.

A regulation method of a heat treatment apparatus according to a second aspect of the present disclosure includes a receiving process of receiving information including a plurality of evaluation indexes, a weight of each evaluation index, the number of times for calculating a value of an evaluation function, and initial parameter values, a simulation performing process of performing a simulation based on the information received by the receiving unit, an evaluation function value calculating process of calculating a value of an evaluation function based on a result of the simulation performed by the simulation performing unit, and a parameter updating process of determining whether the value of the evaluation function calculated by the evaluation function value calculating process is minimum, to update parameters when it is determined that the value of the evaluation function is minimum, wherein, in the evaluation function value calculating process, a value of the evaluation function is calculated again based on the number of times for calculating a value of an evaluation function received by the receiving process, and the regulation method further includes a parameter generating process of generating new parameters by a genetic algorithm when a value of the evaluation function is calculated again by the evaluation function value calculating process.

A non-transitory computer-readable storage medium according to a third aspect of the present disclosure stores a program which causes a computer to function as a receiving unit that receives information including a plurality of evaluation indexes, a weight of each evaluation index, the number of times for calculating a value of an evaluation function, and initial parameter values, a simulation performing unit that performs a simulation based on the information received by the receiving unit, an evaluation function value calculating unit that calculates a value of an evaluation function based on a result of the simulation performed by the simulation performing unit, and a parameter updating unit that determines whether the value of the evaluation function calculated by the evaluation function value calculating unit is minimum, to update parameters when it is determined that the value of the evaluation function is minimum, wherein the evaluation function value calculating unit calculates a value of the evaluation function again based on the number of times for calculating a value of an evaluation function received by the receiving unit, and the program further causes the computer to function as a parameter generating unit that generates new parameters by a genetic algorithm when a value of the evaluation function is calculated again by the evaluation function value calculating unit.

According to the present disclosure, the regulation of parameters may be easily performed.

Hereinafter, an exemplary embodiment of the present disclosure will be described with reference to a case where the heat treatment apparatus, the regulation method of the heat treatment apparatus, and the program of the present disclosure are applied to a batch-type vertical heat treatment apparatus illustrated in FIG. 1, as an example.

As illustrated in FIG. 1, a heat treatment apparatus 1 of the present exemplary embodiment includes a substantially cylindrical reaction tube 2 having a ceiling. The reaction tube 2 is disposed such that its length direction is directed in the vertical direction. The reaction tube 2 is formed of a material which is excellent in heat resistance and corrosion resistance, for example, quartz.

A substantially cylindrical manifold 3 is provided at a lower side of the reaction tube 2. The upper end of the manifold 3 is air-tightly joined to the lower end of the reaction tube 2. An exhaust pipe 4 is air-tightly connected to the manifold 3 to exhaust a gas inside the reaction tube 2. The exhaust pipe 4 is provided with a pressure regulator 5 such as, for example, a valve or a vacuum pump so that the inside of the reaction tube 2 is regulated to a desired pressure (a degree of vacuum).

A cover 6 is provided below the reaction tube 3. The cover 6 is configured to be movable up and down by a boat elevator 7, and disposed such that the lower side (a furnace opening portion) of the manifold 3 (the reaction tube 2) is closed when the cover 6 is moved up by the boat elevator 7, and the lower side (a furnace opening portion) of the manifold 3 (the reaction tube 2) is opened when the cover 6 is moved down by the boat elevator 7.

A wafer boat 9 is provided above the cover 8 through a heat insulating cylinder (a heat insulator) 8. The wafer boat 9 is a wafer holder that accommodates (holds) an object to be processed, for example, a semiconductor wafer W therein. In the present exemplary embodiment, the wafer boat 9 is configured to accommodate therein a plurality of semiconductor wafers W, for example, 150 semiconductor wafers W at a predetermined interval in a vertical direction. In addition, the semiconductor wafers W are accommodated in the wafer boat 9, and the cover 9 is moved up by the boat elevator 7 so that the semiconductor wafers W are loaded into the reaction tube 2.

Figure 2:
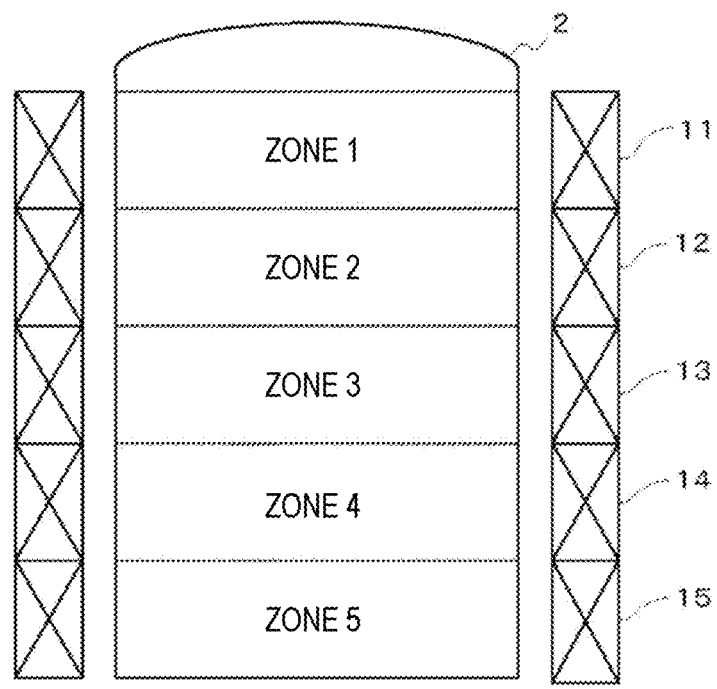
FIG. 2 is a view illustrating zones within a reaction tube.

A heater unit 10 made of, for example, a resistance heating element is provided around the reaction tube 2 to surround the reaction tube 2. The inside of the reaction tube 2 is heated by the heater unit 10 to a predetermined temperature, and as a result, the semiconductor wafers W are heated to the predetermined temperature. The heater unit 10 includes, for example, heaters 11 to 15 arranged in five tiers, and heater controllers 16 to 20 are connected to the heaters 11 to 15, respectively. Therefore, since a power is independently supplied to each of the heater controllers 16 to 20, each of the heaters 11 to 15 may be independently heated to a desired temperature. Thus, the inside of the reaction tube 2 is divided into five zones as illustrated in FIG. 2, by the heaters 11 to 15. For example, when the top portion (Zone 1) within the reaction tube 2 is heated, the heater controller 16 is controlled to heat the heater 11 to a desired temperature. When the center portion (Zone 3) within the reaction tube 2 is heated, the heater controller 18 is controlled to heat the heater 13 to a desired temperature. When the bottom portion (Zone 5) within the reaction tube 2 is heated, the heater controller 20 is controlled to heat the heater 15 to a desired temperature.

In addition, the manifold 3 is provided with a plurality of processing gas supply pipes that supply a processing gas into the reaction tube 2. FIG. 1 represents three processing gas supply pipes 21 to 23 that supply a processing gas to the manifold 3. The processing gas supply pipe 21 is formed to extend from the side of the manifold 3 to the vicinity of the top portion (Zone 1) of the wafer boat 9. The processing gas supply pipe 22 is formed to extend from the lateral side of the manifold 3 to the vicinity of the center portion (Zone 3) of the wafer boat 9. The processing gas supply pipe 23 is formed to extend from the lateral side of the manifold 3 to the vicinity of the bottom portion (Zone 5) of the wafer boat 9.

The processing gas supply pipes 21 to 23 are provided with flow rate regulators 24 to 26, respectively. The flow rate regulators 24 to 26 are configured by, for example, mass flow controllers (MFCs) to regulate a flow rate of the processing gas flowing through the processing gas supply pipes 21 to 23. Thus, the processing gases supplied from the processing gas supply pipes 21 to 23 are regulated to a desired flow rate by the flow rate regulators 24 to 26, respectively, and supplied into the reaction tube 2.

Figure 3:
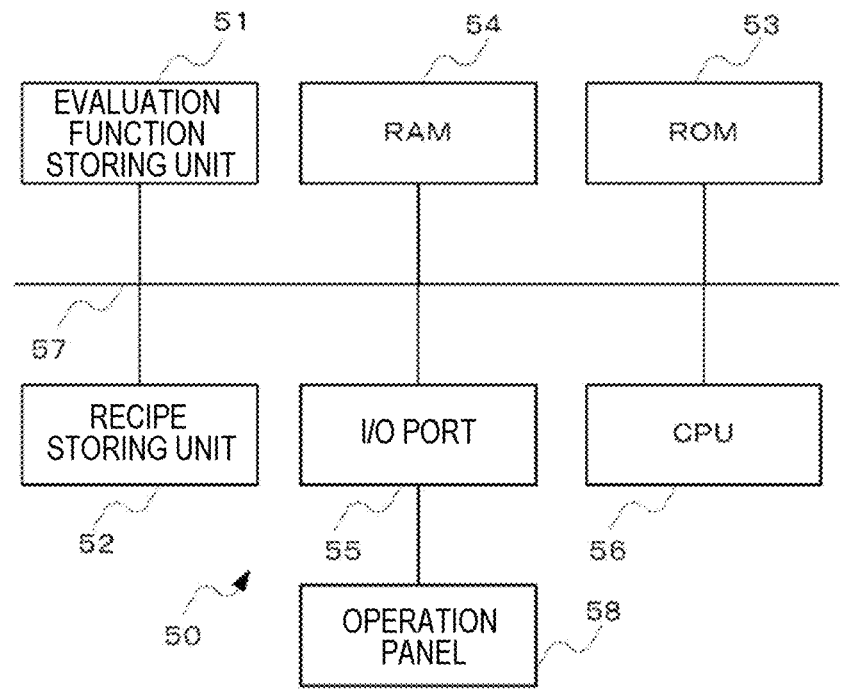
FIG. 3 is a view illustrating an exemplary configuration of a controller in FIG. 1.

In addition, the heat treatment apparatus 1 further includes a controller 50 that controls processing parameters such as, for example, a gas flow rate, a pressure, and a temperature of a processing atmosphere within the reaction tube 2. The controller 50 outputs control signals to, for example, the flow rate regulators 24 to 26, the pressure regulator 5, and the heater controllers 16 to 20 of the heaters 11 to 15. FIG. 3 illustrates a configuration of the controller 50.

As illustrated in FIG. 3, the controller 50 includes an evaluation function storing unit 51, a recipe storing unit 52, a read only memory (ROM) 53, a random access memory (RAM) 54, an input/output (I/O) port 55, a central processing unit (CPU) 56, and a bus 57 that connects these components with each other.

The evaluation function storing unit 51 stores information about an evaluation function. The evaluation function is to evaluate a result obtained from simulating a regulation of parameters (e.g., a temperature), and indicates that a simulation result is good as a value of the evaluation function is small. The CPU 56 calculates a value of the evaluation function by using the information about the evaluation function that is stored in the evaluation function storing unit 51, e.g., various equations for calculating a value of the evaluation function. Details of the evaluation function will be described later.

The recipe storing unit 52 stores a process recipe that determines a control procedure depending on a kind of the film formation processing performed in the heat treatment apparatus 1. The process recipe is a recipe prepared for each processing (process) actually performed by a user, and defines, for example, a temperature, time, and a gas flow rate from loading of the semiconductor wafers W into the reaction tube 2 until unloading of the processed semiconductor wafers W therefrom. Specifically, the process recipe defines, for example, a temperature change of each unit, a pressure change within the reaction tube 2, timings for start and stop of gas supply, and a supply amount.

The ROM 53 is a storage medium that is configured by, for example, an electrically erasable programmable read-only memory (EEPROM), a flash memory, or a hard disk, and stores, for example, an operation program of the CPU 56. The RAM 54 functions as, for example, a work area of the CPU 56.

The I/O port 55 supplies measurement signals for a temperature, a pressure, and a gas flow rate to the CPU 56, and outputs the control signals output by the CPU 56 to the respective units (e.g., the pressure regulator 5, the heater controllers 16 to 20 of the heaters 11 to 15, and the flow rate regulators 24 to 26). In addition, an operation panel 58 is connected to the I/O port 55 to enable an operator to operate the heat treatment apparatus 1.

The CPU 56 is the core of the controller 50, and executes the operation program stored in the ROM 53 to control the operation of the heat treatment apparatus 1 according to the process recipe stored in the recipe storing unit 52 in response to an instruction from the operation panel 58. The bus 57 transfers information between the respective units.

Next, the evaluation function stored in the evaluation function storing unit 51 will be described.

The evaluation function V is calculated by, for example, a sum of products of the respective evaluation indexes and weights thereof as represented by the following equation.

Evaluation function $V = w_1 S_r + w_2 S_z + w_3 e + w_4 U_d + \ldots$

Here, $S_r$, $S_z$, e, and $U_d$ are an example of evaluation indexes, and $w_1$ to $w_4$ are weights of the respective evaluation indexes.

The evaluation indexes are indexes for evaluation of a simulation result, and various indexes may be used. In the present exemplary embodiment, a sum $S_r$ of errors from a target value, a sum $S_z$ of temperature differences among zones, an overshoot e, and a sum $U_d$ of differential absolute values of power are used.

Figure 4:
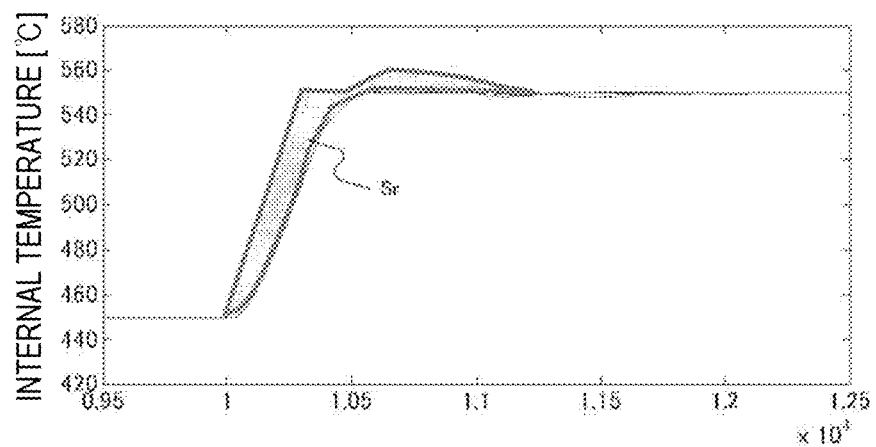
FIG. 4 is a view for explaining a sum of errors from a target value.

As illustrated in FIG. 4, the sum $S_r$ of errors from a target value is a sum of errors between a target temperature and a temperature of a simulation result in the relationship of a temperature within the reaction tube 2 and time, and may be represented by the following equation.

$$S_r = \sum_{i=1}^{n} \sum_{t=t_s}^{t_e} |K_r(i, t) - K(i, t)| \qquad \text{[Equation 1]}$$

Here, n is the number of zones, $t_s$ is evaluation start time (s), $t_e$ is evaluation termination time (s), $Kr(i, t)$ is a target value (° C.), and $K(i, t)$ is a measured value (° C.). In addition, $i = 1, 2, \ldots n$, and $t = 0, 1, 2, \ldots T$ (T is simulation time).

Figure 5:
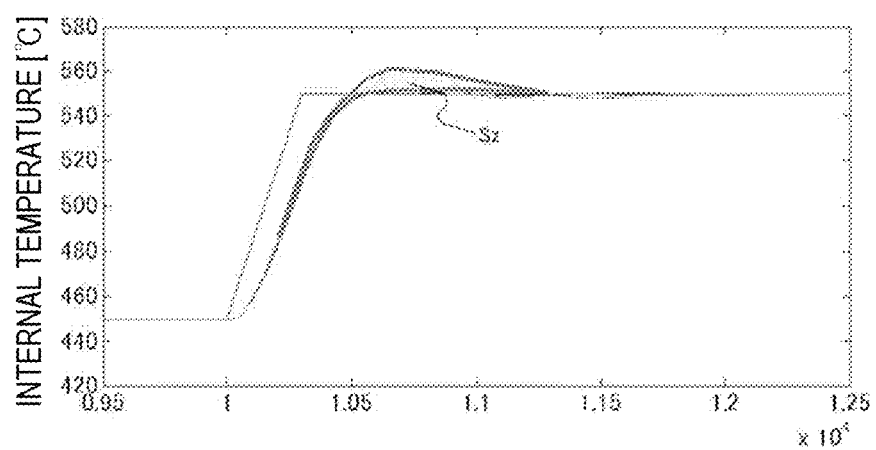
FIG. 5 is a view for explaining a sum of temperature differences among zones.

As illustrated in FIG. 5, the sum $S_z$ of temperature differences among zones is a sum of temperature errors among Zones 1 to 5 in the relationship of a temperature within the reaction tube 2 and time, and may be represented by the following equation.

$$S_z = \sum_{t=t_s}^{t_e} \left\{ \max_i K_r(i, t) - \min_i K(i, t) \right\} \qquad \text{[Equation 2]}$$

Figure 6:
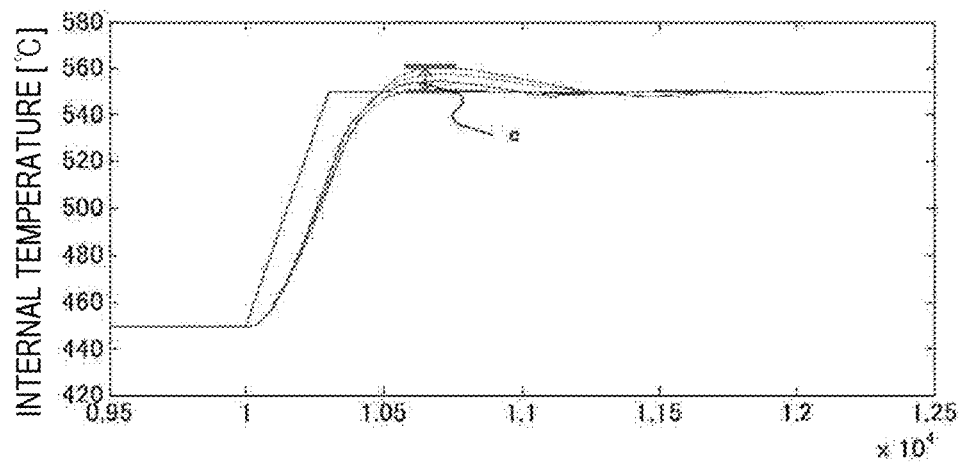
FIG. 6 is a view for explaining an overshoot.

As illustrated in FIG. 6, the overshoot e is a maximum temperature difference at a point where a difference between a temperature of a simulation result and a target temperature is the largest in the relationship of a temperature within the reaction tube 2 and time, and may be represented by the following equation.

$$e = \max_{i, t \in |t_s, t_e|} \{K(i, t) - K_r(i, t)\} \qquad \text{[Equation 3]}$$

Figure 7:
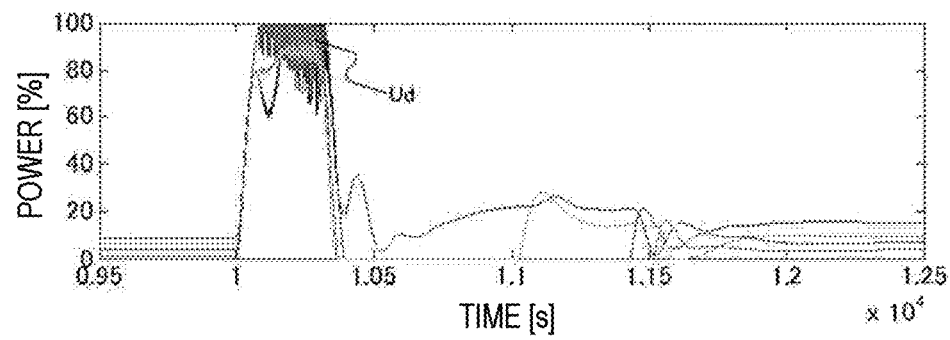
FIG. 7 is a view for explaining a sum of differential absolute values of power.

As illustrated in FIG. 7, the sum $U_d$ of differential absolute values of power is a sum of differential absolute values in the power of the heaters 11 to 15, and may be represented by the following equation.

$$U_d = \sum_{i=1}^{n} \sum_{t=t_s}^{t_e} |u(i, t+1) - u(i, t)|  \quad \text{[Equation 4]}$$

Here, u(i, t) is power (%).

The weight is a value that determines which of the evaluation indexes is to be weighted and how much the evaluation index is to be weighted. For example, weight is given to each evaluation index by setting a large value for a weighty evaluation index and a small value for a less weighty evaluation index as in the following equation.

Evaluation function $V = 5 \times S_r + 5 \times S_z + + 20 \times e + 1 \times U_d + ..$ In addition, predetermined threshold values may be set in the evaluation. The threshold values may be, for example, an overshoot of less than 10° C. and a correction time of less than one minute. When the threshold values are exceeded, a simulation with the parameters is stopped. As described above, when the threshold values are set, the simulation result may be applied smoothly.

Figure 8:
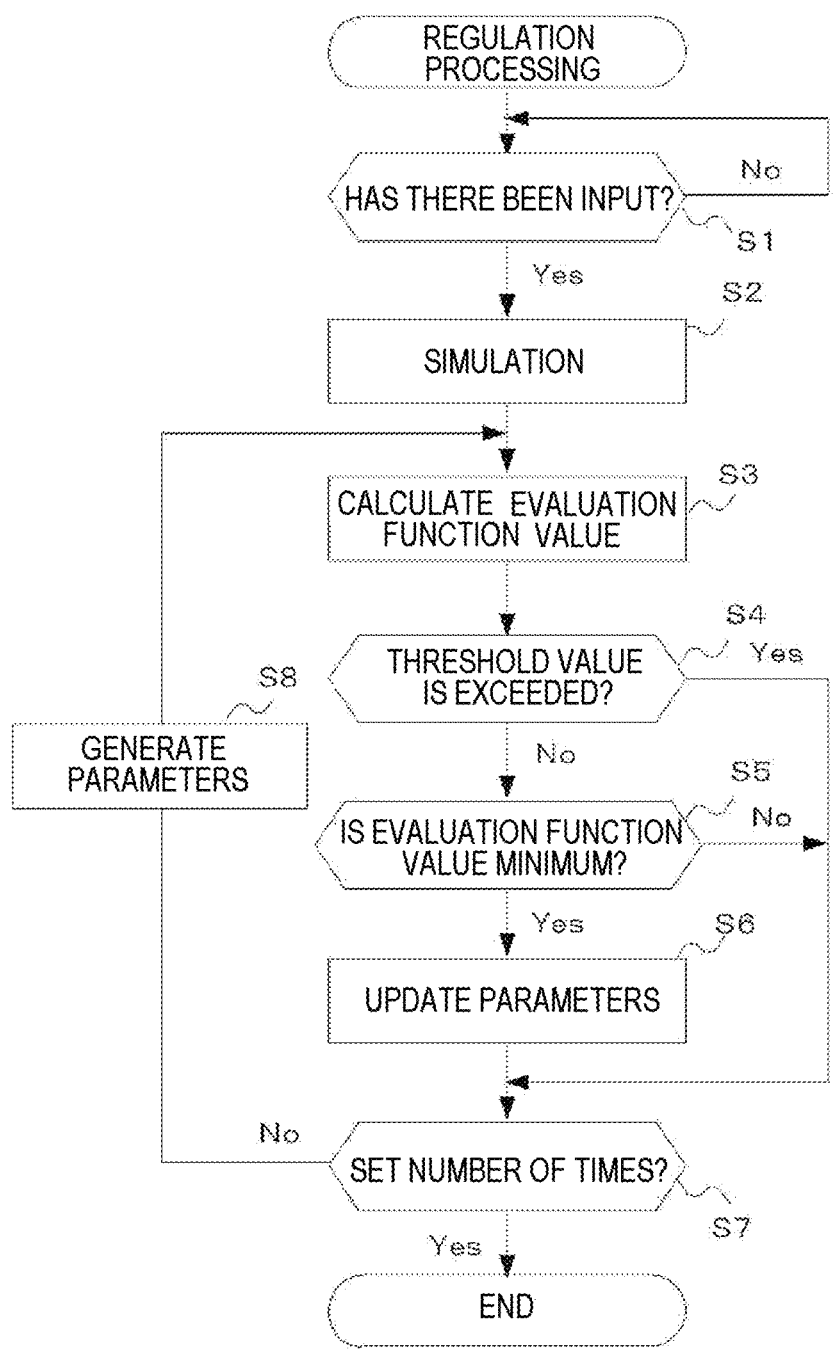
FIG. 8 is a flowchart for explaining a regulation processing.

Next, descriptions will be made on a regulation method (regulation processing) using the heat treatment apparatus 1 configured as described above. FIG. 8 is a flowchart for explaining the regulation processing. In the following descriptions, the operations of the respective units of the heat treatment apparatus 1 are controlled by the controller 50 (CPU 56).

First, an operator inputs required information to be executed in the regulation processing by operating the operation panel 58. Specifically, the operator selects the sum $S_r$ of errors from a target value, the sum $S_z$ of temperature differences among zones, the overshoot e, and the sum $U_d$ of differential absolute values of power, as evaluation indexes, by operating the operation panel 58, and determines weights of the evaluation indexes. In addition, the operator sets a threshold value of an overshoot of less than 10° C. by operating the operation panel 58. In addition, the operator specifies the heat treatment apparatus 1 to be subject to the regulation processing by operating the operation panel 58. In addition, the operator sets the number of times for calculating a value of an evaluation function (e.g., 1,000 times) by operating the operation panel 58.

The CPU 56 determines whether the required information has been input (Step S1). When it is determined that the required information has been input (Step S1: Yes), the CPU 56 performs a simulation based on the input information (Step S2).

Next, the CPU 56 calculates a value of the evaluation function based on a result of the performed simulation (Step S3). For example, the CPU 56 calculates a value of the evaluation function by specifying the sum $S_r$ of errors from a target value, the sum $S_z$ of temperature differences among zones, the overshoot e, and the sum $U_d$ of differential absolute values of power from the simulation results illustrated in FIGS. 4 to 7, respectively, and multiplying each specified value by weight.

Subsequently, the CPU 56 determines whether the set threshold values are exceeded (Step S4). When it is determined that the set threshold values are exceeded (Step S4: Yes), the CPU 56 proceeds to Step S7.

When it is determined that the set threshold values are not exceeded (Step S4: No), the CPU 56 determines whether the calculated value of the evaluation function is minimum (Step S5). When it is determined that the calculated value of the evaluation function is minimum (Step S5: Yes), the CPU 56 updates the parameters (Step S6), and proceeds to Step S7. As a result, the parameters are updated to parameters resulting in the minimum value of the evaluation function. When it is determined that the calculated value of the evaluation function is not minimum (Step S5: No), the CPU 56 proceeds to Step S7.

Next, the CPU 56 determines whether the number of times for calculating a value of an evaluation function reaches the set number of times (Step S7). When it is determined when the number of times for calculating a value of an evaluation function does not reach the set number of times (Step S7: No), the CPU 56 generates parameters (Step S8), and returns to Step S3.

In Step S8, for example, PID parameters with a minimum value of the evaluation function are generated by, for example, a genetic algorithm. The genetic algorithm is a heuristic algorithm that mimics the process of adaptation and evolution of living things in an environment, and a technique to find a solution to give an optimal value to an individual the most adaptive to an environment, i.e., a target function. In the genetic algorithm, the individual is expressed on a string, called a chromosome, in which a value of a design variable is coded, and a value of the target function is calculated by decoding the chromosome to thereby read the design variable.

When it is determined that the number of times for calculating a value of an evaluation function reaches the set number of times (Step S7: Yes), the CPU 56 ends the processing.

Figure 9:
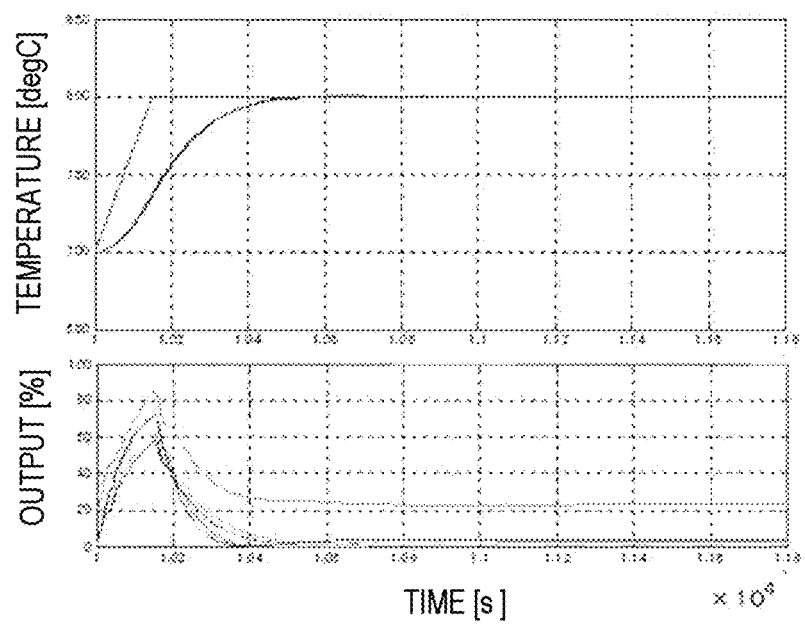
FIG. 9 is a view illustrating a simulation result obtained in a case where a temperature within a reaction tube is increased from 700° C. to 800° C.
Figure 10:
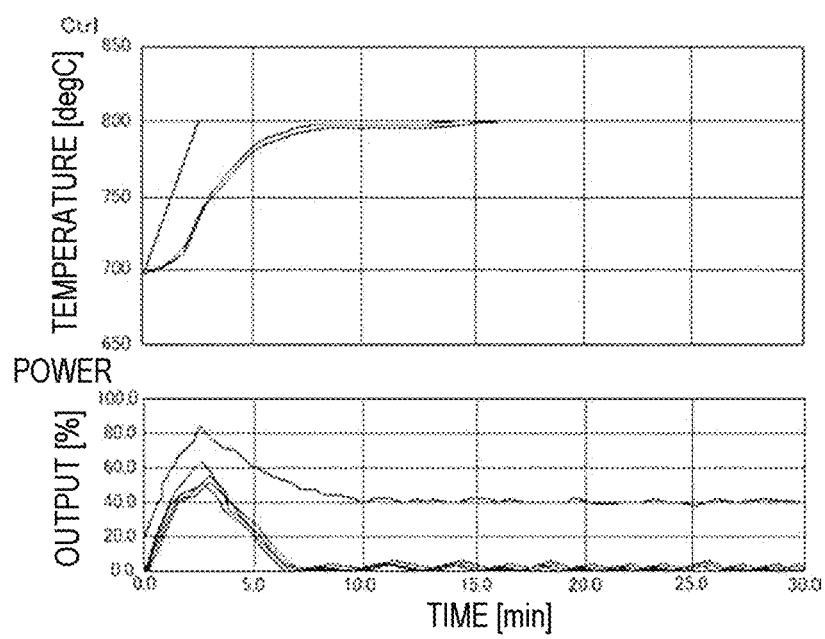
FIG. 10 is a view illustrating a test result obtained from an actual machine in the case where the temperature within the reaction tube is increased from 700° C. to 800° C.

Next, in order to verify the effect of the present disclosure, the simulation result and a test result obtained from an actual machine were compared with each other with respect to the case where the temperature within the reaction tube 2 is increased from 700° C. to 800° C. FIG. 9 represents the simulation result, and FIG. 10 represents the test result obtained from the actual machine. As illustrated in FIGS. 9 and 10, substantially the same results were obtained in the case where the temperature within the reaction tube 2 is increased from 700° C. to 800° C. Therefore, it was confirmed that no problem exists in the regulation processing based on the simulation result.

As described above, according to the present exemplary embodiment, the parameters are updated to the parameters resulting in the minimum value of the evaluation function by the regulation processing. Therefore, the regulation of the parameters may be easily performed by the one-time simulation and regulation processing.

According to the present exemplary embodiment, since the parameters resulting in the minimum value of the evaluation function are generated by, for example, the genetic algorithm, the initial values may be determined and regulated thoroughly from the entire solution space. Therefore, an entire optimal solution is easily obtained.

In addition, the present disclosure is not limited to the above-described exemplary embodiment, and various modifications and applications may be made thereto. Hereinafter, other exemplary embodiments which are applicable to the present disclosure will be described.

In the above-described exemplary embodiment, the present disclosure has been described with reference to the case of using, as evaluation indexes, the sum $S_r$ of errors from a target value, the sum $S_z$ of temperature differences among zones, the overshoot e, and the sum $U_d$ of differential absolute values of power, as an example. However, at least two evaluation indexes may be used. In addition, evaluation indexes other than the above-described evaluation indexes may be used. In this case as well, the regulation of the parameters may be easily performed by the one-time simulation and regulation processing.

As evaluation indexes, at least, the sum $S_r$ of errors from a target value and the sum $U_d$ of differential absolute values of power are preferably used. This is because the evaluation indexes largely contribute to a value of the evaluation function, thereby, improving the accuracy in the regulation of the parameters.

In the above-described exemplary embodiment, the present disclosure has been described with reference to the case of using the threshold values, as an example. However, the parameters resulting in the minimum value of the evaluation function may be calculated without using the threshold values. In this case as well, the regulation of the parameters may be easily performed by the one-time simulation and regulation processing.

In the above-described exemplary embodiment, the present disclosure has been described with reference to the case where the number of tiers of the heaters (the number of zones) is five, as an example. However, the number of tiers of the heaters may be four (4) or less or six (6) or more. Further, the number of the semiconductor wafers W extracted from each zone may be arbitrarily set.

In the above-described exemplary embodiment, the present disclosure has been described with reference to the case of the batch-type heat treatment apparatus having a single tube structure, as an example. However, the present disclosure may be applied to, for example, a batch-type vertical heat treatment apparatus having a double tube structure in which the reaction tube 2 is formed with an inner tube and an outer tube. The present disclosure is not limited to the processing of the semiconductor wafers W, but is also applicable to a processing of, for example, flat panel display (FPD) substrates, glass substrates, or plasma display panel (PDP) substrates.

The controller 50 according to the present exemplary embodiment may be implemented by using a general computer system, regardless of a dedicated system. For example, the controller 50 that executes the foregoing processing may be configured by installing a program for executing the foregoing processing in a generally used computer, from a storage medium (e.g., a flexible disc or a compact disc read only memory (CD-ROM)) storing the program.

In addition, a means to supply the program is arbitrary. The program may be supplied through, for example, a communication line, a communication network, or a communication system, besides the predetermined storage medium as described above. In this case, the program may be uploaded on, for example, a bulletin board system (BBS) of a communication network and provided in superposition on carrier waves through the network. The thus-provided program is started and executed similarly to other application programs under a control of an operating system (OS) so that the foregoing processing may be performed.

The present disclosure is useful for a heat treatment apparatus that performs heat treatment on workpieces such as, for example, semiconductor wafers, a regulation method of the heat treatment apparatus, and a program.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A heat treatment apparatus comprising:
a reaction tube into which at least one semiconductor wafer is loaded; and
a memory which stores program instructions to allow the heat treatment apparatus to:
cause receiving circuitry to receive information including a plurality of evaluation indexes, a weight of each evaluation index, the number of times for calculating a value of an evaluation function, and initial parameter values;
calculate the value of the evaluation function based on the plurality of evaluation indexes, the weight of each evaluation index, the number of times for calculating the value of the evaluation function, and initial parameter values; and
determine whether the value of the evaluation function is minimum, and to update parameters when it is determined that the value of the evaluation function is minimum,
wherein the value of the evaluation function is calculated again based on the number of times for calculating the value of an evaluation function received by the receiving circuitry so as to prevent from repeating regulation and a test of parameters multiple times,
wherein new parameters are generated by a genetic algorithm when the value of the evaluation function is calculated again.

2. The heat treatment apparatus of claim 1, wherein the evaluation indexes are, at least, a sum of errors from a target value and a sum of absolute values of differentiation of a power.

3. The heat treatment apparatus of claim 1, wherein the information received by the receiving circuitry includes threshold values of the evaluation indexes.

4. A regulation method performed by a heat treatment apparatus, the apparatus including a reaction tube into which at least one semiconductor wafer is loaded, which stores program instructions to implement the regulation method comprising:
a receiving process, of receiving information including a plurality of evaluation indexes, a weight of each evaluation index, the number of times for calculating a value of an evaluation function, and initial parameter values;
an evaluation function value calculating process of calculating the value of the evaluation function based on the plurality of evaluation indexes, the weight of each evaluation index, the number of times for calculating the value of the evaluation function, and the initial parameter values; and
a parameter updating process of determining whether the value of the evaluation function calculated by the evaluation function value calculating process is minimum, and to update parameters when it is determined that the value of the evaluation function is minimum,
wherein, in the evaluation function value calculating process, the value of the evaluation function is calculated again based on the number of times for calculating the value of the evaluation function received by the receiving process so as to prevent from repeating regulation and a test of parameters multiple times, and
the regulation method further comprises a parameter generating process of generating new parameters by a genetic algorithm when the value of the evaluation function is calculated again by the evaluation function value calculating process.

5. A non-transitory computer-readable storage medium which stores program instructions executed by a computer so as to:
- cause receiving circuitry to receive information including a plurality of evaluation indexes, a weight of each evaluation index, the number of times for calculating a value of an evaluation function, and initial parameter values;
- cause the computer to calculate the value of the evaluation function based on the plurality of evaluation indexes, the weight of each evaluation index, the number of times for calculating the value of the evaluation function, and the initial parameter values; and
- cause the computer to determine whether the value of the evaluation function is minimum, and to update parameters when it is determined that the value of the evaluation function is minimum,
- wherein the value of the evaluation function is calculated again based on the number of times for calculating the value of the evaluation function received by the receiving circuitry so as to prevent from repeating regulation and a test of parameters multiple times, and
- new parameters are generated by a genetic algorithm when the value of the evaluation function is calculated again,
- wherein the parameters are related to a processing atmosphere within a reaction tube into which at least one semiconductor wafer is loaded.

6. The heat treatment apparatus of claim 1, wherein the computer includes a storage which stores information about an evaluation function, and
- wherein the information about an evaluation function includes the evaluation function calculated by a sum of products of the respective evaluation indexes and weights.

7. The heat treatment apparatus of claim 3, wherein the evaluation indexes are, at least, a sum of temperature differences among zones and an overshoot.

8. The heat treatment apparatus of claim 1, wherein the heat treatment apparatus further comprises a recipe storage which stores a process recipe that determines a control procedure, is connected to an operation panel and controls the operation of the heat treatment apparatus according to the process recipe stored in the recipe storage in response to an instruction from the operation panel.

9. The heat treatment apparatus of claim 1,
- wherein the number of times for calculating the value of the evaluation function is set by an operator using an operation panel.

* * * * *